(12) United States Patent
Cooper et al.

(10) Patent No.: US 10,234,887 B2
(45) Date of Patent: Mar. 19, 2019

(54) OUTPUT DRIVER HAVING REDUCED ELECTROMAGNETIC SUSCEPTIBILITY AND ASSOCIATED METHODS

(71) Applicant: Allegro Microsystems, LLC, Worcester, MA (US)

(72) Inventors: Richard B. Cooper, Shrewsbury, MA (US); Maxim Klebanov, Newton, MA (US); Washington Lamar, Mount Vernon, NH (US); Devon Fernandez, Londonderry, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 263 days.

(21) Appl. No.: 15/161,529

(22) Filed: May 23, 2016

(65) Prior Publication Data

US 2016/0282893 A1    Sep. 29, 2016

Related U.S. Application Data

(63) Continuation-in-part of application No. 13/727,108, filed on Dec. 26, 2012.

(51) Int. Cl.
*G06F 3/02* (2006.01)
*G05F 3/02* (2006.01)
(Continued)

(52) U.S. Cl.
CPC ............. *G05F 3/02* (2013.01); *H01L 43/02* (2013.01); *H03K 19/00361* (2013.01); *H01L 27/0259* (2013.01); *H01L 27/0266* (2013.01)

(58) Field of Classification Search
CPC ...................................................... G05F 3/02
See application file for complete search history.

(56) References Cited

U.S. PATENT DOCUMENTS

| | | | |
|---|---|---|---|
| 6,212,050 B1 | 4/2001 | Haider | |
| 8,258,823 B2 | 9/2012 | Prior et al. | |
| 8,330,504 B2* | 12/2012 | Olson | H03K 17/145 326/82 |
| 8,519,402 B2* | 8/2013 | Voldman | H01L 21/823892 257/69 |

(Continued)

FOREIGN PATENT DOCUMENTS

| | | |
|---|---|---|
| EP | 1 369 997 A2 | 12/2003 |
| EP | 1 369 997 A3 | 12/2003 |

OTHER PUBLICATIONS

U.S. Appl. No. 14/678,388, filed Apr. 3, 2015, Chappell, et al.
(Continued)

*Primary Examiner* — Hai L Nguyen
(74) *Attorney, Agent, or Firm* — Daly Crowley Mofford & Durkee LLP

(57) ABSTRACT

An electronic circuit includes semiconductor substrate having a first doping type and a reference terminal coupled to the semiconductor substrate. A tub area having a second doping type is formed in the semiconductor substrate. A well area having the first doping type is formed within the tub area. A driver circuit comprising a transistor is formed within the well area and has an output terminal. A control circuit is coupled to the driver circuit for controlling the driver circuit. A second transistor is within the well area and coupled in series between the driver circuit and the output terminal, the second transistor having a first terminal coupled to the driver circuit and a second terminal coupled to the output terminal. A biasing circuit is coupled to a gate terminal of the second transistor and configured to bias the transistor to a conducting state.

21 Claims, 9 Drawing Sheets

(51) Int. Cl.
  *H01L 43/02* (2006.01)
  *H03K 19/003* (2006.01)
  *H01L 27/02* (2006.01)

(56) References Cited

U.S. PATENT DOCUMENTS

| | | | |
|---|---|---|---|
| 9,318,481 | B1 | 4/2016 | Wang et al. |
| 9,786,652 | B2 * | 10/2017 | Zhan .................. H01L 27/0262 |
| 2003/0189448 | A1 | 10/2003 | Boemler |
| 2005/0237681 | A1 | 10/2005 | Chen |
| 2010/0315748 | A1 | 12/2010 | Kwong et al. |
| 2015/0236011 | A1 | 8/2015 | Wang et al. |

OTHER PUBLICATIONS

U.S. Appl. No. 14/681,575, filed Apr. 8, 2016, Casaretti, et al.
U.S. Appl. No. 15/089,787, filed Apr. 4, 2016, Kuo, et al.
Allegro White Paper; "ATS601LSG Single Element, Tooth Detecting Speed Sensor;" Jul. 18, 2012; 12 pages.
PCT Search Report and Written Opinion of the ISA dated Feb. 11, 2014; for PCT Pat. App. No. PCT/US2013/071146; 13 pages.
PCT International Preliminary Report on Patentability for App. No. PCT/US2013/071146, dated Jun. 30, 2015.
Non-Final Office Action dated Aug. 6, 2015; for U.S. Appl. No. 13/727,108, 13 pages.
Response filed on Oct. 30, 2015 to Non-Final Office Action dated Aug. 6, 2015; for U.S. Appl. No. 13/727,108, 11 pages.
Final Office Action dated Nov. 25, 2015; for U.S. Appl. No. 13/727,108, 10 pages.
Response (with summary and claims) field on Feb. 9, 2016 to Office Action dated Jul. 30, 2015; PCT Pat. App. No. PCT/US13/071146; 12 pages.

* cited by examiner

OUTPUT DRIVER HAVING REDUCED ELECTROMAGNETIC SUSCEPTIBILITY AND ASSOCIATED METHODS

RELATED APPLICATIONS

This application is a CONTINUATION-IN-PART of U.S. patent application Ser. No. 13/727,108 (filed Dec. 26, 2012), which is incorporated here by reference in its entirety.

FIELD

Subject matter disclosed herein relates generally to integrated circuits and, more particularly, to techniques and circuits for reducing the electromagnetic susceptibility of driver circuitry within integrated circuits.

BACKGROUND

A weakly driven output driver circuit can be susceptible to pulsed radiated and conducted electromagnetic interference (EMI) noise sources. Transients from EMI sources can cause the output driver to change state, resulting in false output pulses or no output at all. This issue can be exacerbated if the driver is connected to a load circuit via a long conductor. The long conductor can act as an antenna that couples the EMI into the circuit to cause transient errors.

Various techniques can be used to reduce a circuit's susceptibility to electromagnetic interference. These techniques include improving shielding of the circuit or cable, addition of ferrite beads, filtering, modification of ground and power plane routing, etc. However, these techniques can be expensive or impractical in certain circuits. If, for example, the driver circuit is part of a remote sensor, it may be difficult to modify ground and power routing, or cost prohibitive to add shielding or ferrite beads.

In certain instances, overstress current (e.g. current caused by an overstress condition such as EMI or electrostatic discharge (ESD)) flowing through an integrated circuit may result in the injection of minority carriers into the circuit's substrate. If the minority carriers are electrons in a p-doped substrate, the electrons may remain in the substrate without recombination for relatively long period of time and diffuse considerable distances through the substrate to reach other sections of the circuit, where they may be collected by a positively biased n-tubs. The currents associated with the collection of electrons by other n-tubs can cause malfunction in other circuits.

SUMMARY

In an embodiment, an electronic circuit includes a semiconductor substrate having a first doping type and a reference terminal coupled to the semiconductor substrate. A tub area having a second doping type is formed in the semiconductor substrate. A well area having the first doping type is formed within the tub area. A driver circuit comprising a first transistor is formed within the well area and having an output terminal that can be coupled to a load to drive the load. A control circuit is coupled to the driver circuit for controlling the driver circuit. A second transistor is formed within the well area and coupled in series between the driver circuit and the output terminal, the second transistor having a first terminal coupled to the driver circuit and a second terminal coupled to the output terminal. A biasing circuit is coupled to a gate terminal of the second transistor and configured to bias the transistor to a conducting state.

In another embodiment, an apparatus includes a semiconductor substrate and a reference terminal coupled to the semiconductor substrate. A well area is formed within the substrate. A transistor is formed within the well area, the transistor having a first terminal coupled to a driver circuit and a second terminal coupled to an output terminal. A biasing circuit is coupled to a gate terminal of the transistor and configured to bias the transistor to a conducting state. The apparatus includes an overvoltage conduction path through the substrate between the reference terminal and the output terminal. The overvoltage conduction path includes a PN junction formed between the substrate and a tub area formed within the substrate, and a PN junction formed between the well area and a high voltage drain area associated with the transistor.

In another embodiment, an electronic circuit includes a driver circuit having an output terminal that can be coupled to a load to drive the load. A control circuit is coupled to the driver circuit for controlling the driver circuit. A transistor is coupled in series between the driver circuit and the output terminal. The transistor has a first terminal coupled to the driver circuit and a second terminal coupled to the output terminal. A biasing circuit is coupled to a gate terminal of the transistor and configured to provide a constant voltage to the gate terminal to bias the transistor to a conducting state to reduce the susceptibility of the electronic circuit to electromagnetic interference. The biasing circuit includes a voltage regulator, a Zener diode, and a capacitor. The Zener diode and capacitor are coupled to the gate terminal and a reference terminal.

BRIEF DESCRIPTION OF THE DRAWINGS

The foregoing features may be more fully understood from the following description of the drawings in which.

Like reference numbers in the drawings may denote like elements.

DETAILED DESCRIPTION

Figure 1:
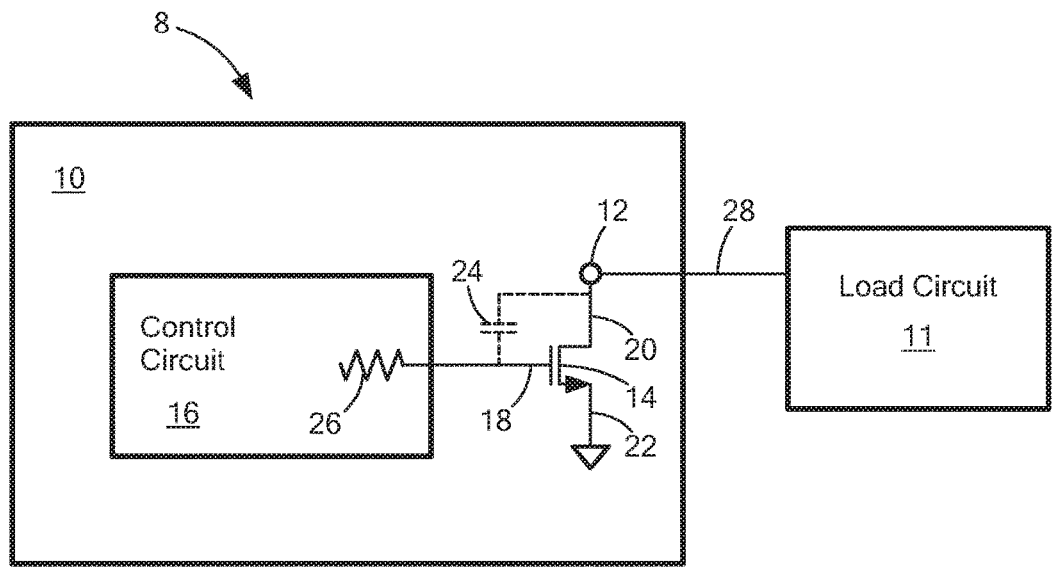
FIG. 1 is a schematic diagram illustrating a conventional output driver circuit.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or perturbations in a magnetic field generated by a back bias magnet where the perturbations are caused by a rotating ferromagnetic article, and a magnetic field sensor that senses a magnetic field density of a magnetic field.

Magnetic field sensors often include driver circuits that can drive an output signal of the magnetic field sensor. These driver circuits often produce an output signal that switches between a high and low depending upon whether a magnetic field sensing element senses a magnetic target or a magnetic field of a particular strength. In some cases, depending upon the location where the magnetic field sensor is installed, the driver circuit may have to drive the output signal across a long conductor or cable harness. For example, if the magnetic field sensor is installed in a vehicle's transmission (e.g. on a camshaft), the conductor harness running from the magnetic field sensor to a central processor may be a few feet or a few meters in length. Such a long cable may be susceptible to EMI from the vehicle's engine, transmission, or other circuits.

FIG. 1 is a schematic diagram illustrating a conventional output driver circuit 8 that may be used to provide an output signal for an integrated circuit (IC) 10. For example, a load circuit 11 may be connected to an output terminal 12 of the IC 10. As illustrated, output driver circuit 8 may include a driver device 14 and a control circuit 16. The output driver device 14 may be a transistor such as, for example, a field effect transistor (FET) that includes a gate terminal 18, a drain terminal 20, and a source terminal 22. The drain terminal 20 of the output driver device 14 may be coupled to the output terminal 12 and the load circuit 11.

Output driver device 14 includes a gate-to-drain parasitic capacitance (Cgd) 24 and a gate-to-source parasitic capacitance (Cgs) (not shown). As will be appreciated, these parasitic capacitances may provide a degree or amount of coupling between gate terminal 18 and drain and source terminals 20, 22, respectively. In cases where output driver device 14 is being weakly driven by gate control circuit 16, electromagnetic interference (EMI) received at the integrated circuit (from, for example, a pulsed radar system or other EMI source that can couple to the conductor 28) can couple through one or both of the parasitic capacitances and change the output state of device 14. This can create errors in the data delivered to the load device.

A transistor may be considered "weakly driven" when a drive source has a relatively high impedance with relatively low current capability, resulting in slower device turn-on. For example, control circuit 16 may have an output resistance 26. If resistance 26 is high, control circuit 16 may drive gate terminal 18 relatively weakly, which may allow external forces such as EMI to cause interference with the operation of electronic circuit 8.

During operation, gate control circuit 16 drives the gate terminal 18 of the output driver device 14 such that when a threshold voltage is reached the device conducts to generate transition between a high voltage (i.e. a logic one) and a low voltage (i.e. a logic zero) signal value on output terminal 12. An intermediate voltage may also be generated.

In an embodiment, load circuit 11 may be a pull-up resistor that pulls the voltage at the output terminal 12 high when the driver device 14 is not conducting. When the driver device 14 is conducting, the driver device 14 may pull the voltage at the output terminal 12 down to a voltage at or near ground. Note that although the example above assumes that a high voltage is a logic one and a low voltage is a logic zero, in an embodiment, a high voltage may be interpreted as a logic zero and a low voltage may be interpreted as a logic one, depending upon design requirements. The load circuit 11 may also be an LED, a bank of LEDs, a motor, or any other type of load that can be driven by the driver device 14.

Figure 2:
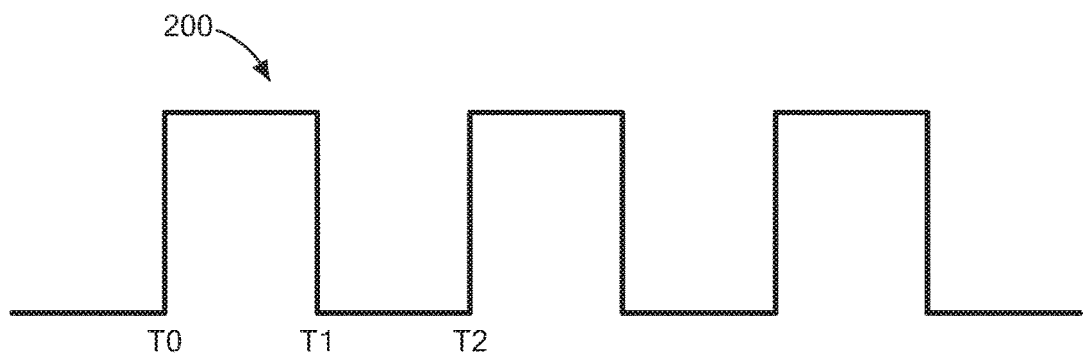
FIG. 2 is a graph of a waveform illustrating an ideal output of an output driver circuit.

FIG. 2 is a waveform diagram of an ideal output of the driver device 14. The horizontal axis of the waveform 200 is time and the vertical axis is voltage. At time T0 the control circuit 16 may drive the gate terminal 18 so that the voltage at the output terminal 12 becomes high. At time T1, the control circuit 16 may drive the gate terminal 18 so that the voltage at the output terminal 12 becomes low. The control circuit 16 may continue to drive the gate terminal 18 as required so that the voltage at the output terminal 12 becomes high and low accordingly. As shown in FIG. 2, the control circuit 16 may drive the gate terminal 18 so that an alternating voltage waveform occurs at the output terminal 12.

The parasitic capacitance 24 may, in some circumstances, create a failure mode that unintentionally causes the driver device 14 to change state (i.e. to unintentionally turn the driver device 14 on or off). This can cause errors in the output signal. For example, assume that the conductor 28 coupled between the output terminal 12 and the load circuit 11 acts as an antenna in the presence of EMI. EMI pulses on the conductor 28 may charge or discharge the parasitic capacitance 24, which may increase or decrease a voltage differential between the drain terminal 20 and the gate terminal 18. If the series resistance 26 is high enough, this voltage differential can effectively drive the gate terminal 18 of the driver device 14, resulting in the driver device 14 inadvertently switching state. When the driver device 14 inadvertently switches state, it may cause unintended transitions or aberrations on the waveform 200.

Figure 3:
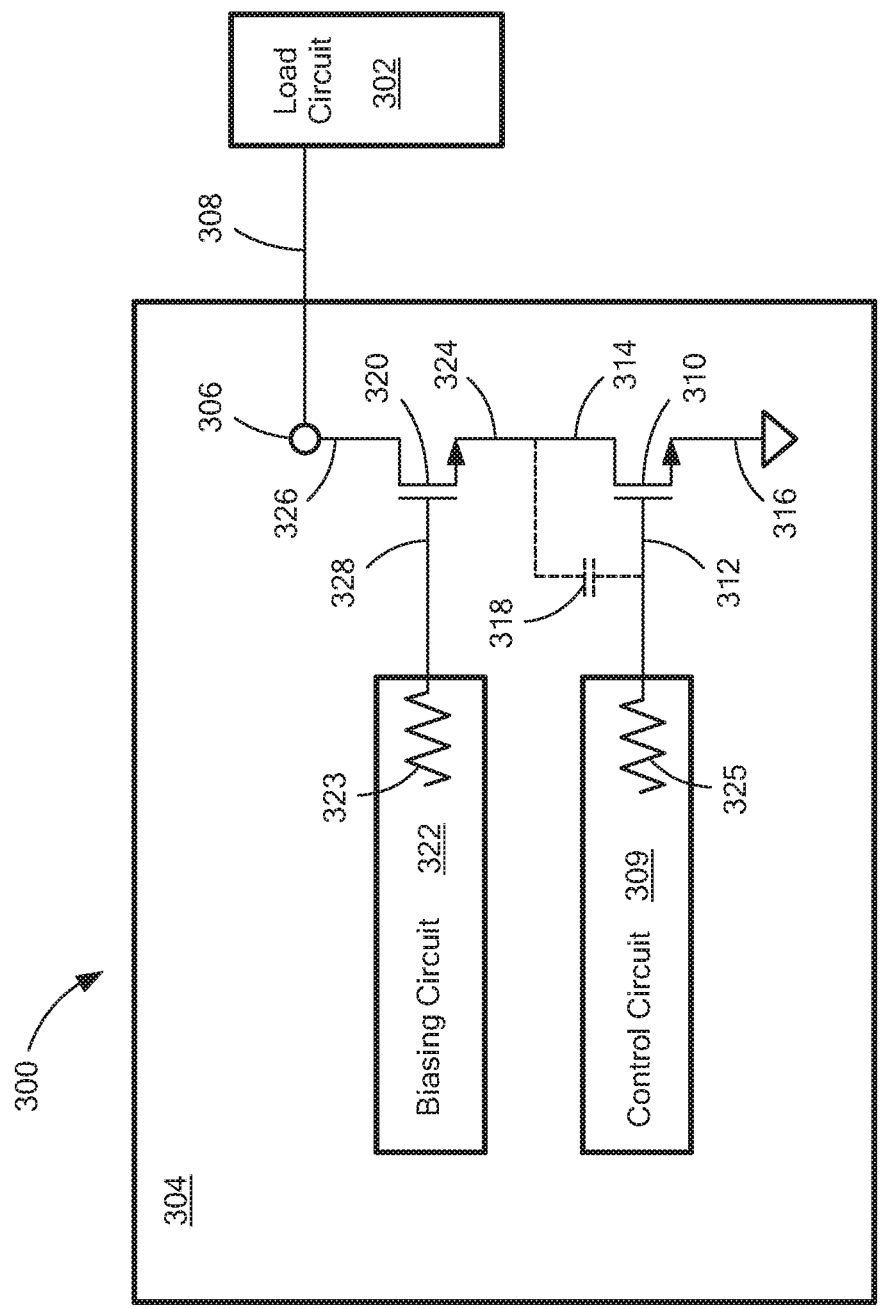
FIG. 3 is a schematic diagram of an embodiment of an output driver circuit.

FIG. 3 is a block diagram of an electronic circuit (e.g. an IC) 304 containing a driver circuit 300 for driving a load circuit 302. The load circuit 302 may be a pull-up resistor. The load circuit 302 may also be an LED, a bank of LEDs, a motor, or any other type of load that can be driven by the driver circuit 300. In an embodiment, the driver circuit 300 can be an output driver of a magnetic field sensor 304 or other type of integrated circuit. As examples, a magnetic field sensor 304 may be installed in a vehicle in order to detect the speed, position, and/or direction of, for example, a camshaft or wheel. As a magnetic target, or features of a target such as gear teeth, on or coupled to a wheel or camshaft pass the magnetic field sensor 304, the magnetic field sensor 304 may drive an output to indicate a speed of rotation of the wheel or position of the camshaft, respectively. In an embodiment, the magnetic field sensor 304 may include an output driver circuit, such as the driver circuit 300, that can drive the output. The magnetic field sensor 304 may be implemented as an IC or as multiple ICs, which may comprise the driver circuit 300.

The driver circuit 300 may include a control circuit 309 and a driver device 310 for driving the load circuit 302. The driver device 310 may be an n-channel FET and may have a gate terminal 312, a drain terminal 314, and a source terminal 316. A parasitic capacitance 318 may be present between the drain terminal 314 and the gate terminal 312. The control circuit 309 may be coupled to and drive the gate terminal 312 of the driver device 310 so that the control circuit 309 can cause the driver device 310 to conduct or to turn off.

If the sensor 304 is installed within an automotive transmission, the conductor 308 may be relatively long, e.g., long enough to extend from the location of installation to a central processor. This may require the conductor 308 to be several inches long, several feet long, or several meters long. As described above, this can cause the conductor 308 to act as an antenna, which can charge and/or discharge the parasitic capacitance 318, cause the output of the driver device 310 to inadvertently change state, and introduce EMI-induced errors onto the output terminal 306.

To reduce the occurrence of such errors, the driver circuit 300 may include a buffer device 320 and a biasing circuit 322. In an embodiment, the buffer device 320 may be an n-channel FET and may comprise a source terminal 324 coupled to the drain terminal 314 of the driver device 310, a drain terminal 326 coupled to the output terminal 306, and a gate terminal 328 coupled to the biasing circuit 322. In other words, the buffer device 320 may be coupled in series between the output terminal 306 and the driver device 310. The buffer device 320 may also have a parasitic capacitance (not shown) between each pair of terminals, including between the drain terminal 326 and the gate terminal 328. In other embodiments, the buffer device 320 may be a BJT, a logic gate such as an inverter, or any other active circuit that can be driven to a conducting state. Also, although both the buffer device 320 and the driver device 310 are shown as the same type of component (i.e., shown as n-channel FETs), the buffer device 320 and the driver device 310 may be mixed and matched from different types of circuits or components. For example, in an embodiment, the buffer device 320 may be one of an n-channel FET, a p-channel FET, a BJT, a logic gate, multiple devices in series or parallel, or any appropriate type of buffer device 320, and the driver device 310 may be one of an n-channel FET, a p-channel FET, a BJT, a logic device, multiple devices in series or parallel, or any other appropriate driver device.

Although both the buffer device 320 and the driver device 310 are shown as n-channel FETs, either or both devices can be replaced by other circuits or devices including, but not limited to, npn BJTs, pnp BJTs, p-channel FETs, logic gates, multiple devices connected in series or parallel configurations, etc.

In operation, the biasing circuit 322 may drive the voltage at the gate terminal 328 so that the buffer device 320 remains on, i.e. in a conducting state. While the buffer device 320 is conducting, the buffer device 320 may not affect the ability of the driver device 310 to drive the output. In other words, when the buffer device 320 is on, the driver device 310 may still be able to pull the voltage at the output terminal 306 low. Also, with the buffer device 320 on, the driver device 310 may be able to enter a non-conducting state so that the voltage at the output terminal 306 can be pulled up to a logic one level by the load circuit 302.

In an embodiment, the biasing circuit 322 may provide a constant voltage to the gate terminal 328. For example, the biasing circuit 322 may set the voltage at the gate terminal 328 to a level that allows the buffer device 320 to remain in a conducting state. If the biasing device 320 is a FET, the biasing circuit 322 may set the voltage at the gate terminal 328 to place the FET into saturation or a conductive tristate.

The biasing circuit 322 may have a relatively low output resistance 323 so that the buffer device 320 is not weakly driven. For example, the biasing circuit may be a resistor divider with relatively low resistance, a voltage regulator, or any other circuit with relatively low output resistance that can drive the gate terminal 328 to a particular voltage. In an embodiment, the output resistance 323 of the biasing circuit will be relatively lower than the output resistance of the output resistance 325 of the control circuit 309. This may allow the biasing circuit 322 to drive the buffer device 320 more strongly than the control circuit 309 drives the driver device 310.

The low output resistance 323 can help to reduce the effects of EMI interference from an external source. Assume that EMI pulses are introduced onto the conductor 308. The EMI pulses may act to charge or discharge the parasitic capacitance between the drain terminal 326 and the gate terminal 328. However, since the biasing circuit 322 has a relatively low output resistance 323, the biasing circuit 322 may be able to drive the gate terminal 328 strongly enough so that the EMI pulses are unable to cause the buffer device 320 to switch state. Since the buffer device 320 driven hard, it may be less likely to switch state in the presence of EMI, and it may act as a buffer and isolate the driver device 310 from the effects of EMI pulses on the conductor 308. In alternate embodiments the output resistance 323 may be equal to or greater than the output resistance 325, so long as the biasing circuit 322 can drive the gate terminal 328 more strongly than the control circuit 309 may drive the gate terminal 312.

Figure 3A:
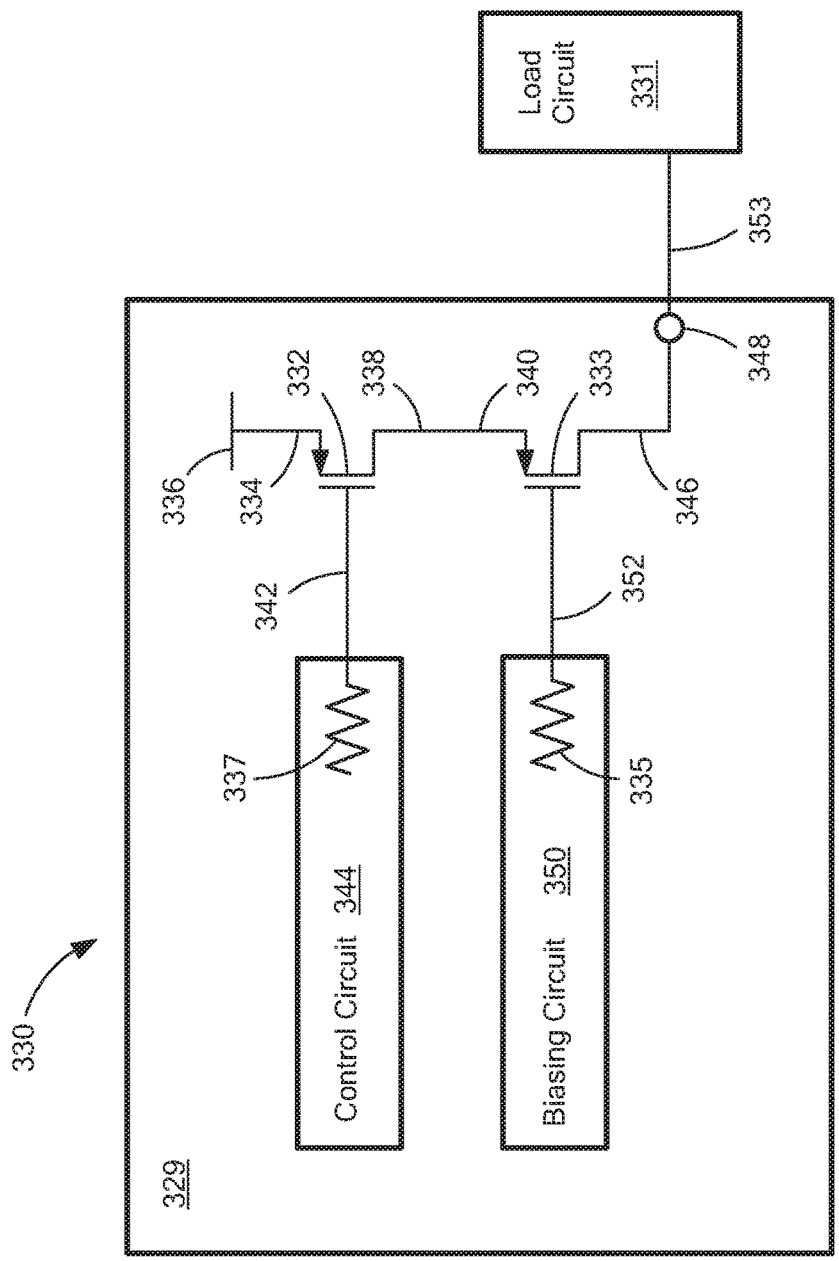
FIG. 3A is a schematic diagram of an embodiment of an output driver circuit.

FIG. 3A illustrates another embodiment of an electronic circuit 329 that may contain a driver circuit 330 for driving a load 331. The load circuit 331 may be a pull down resistor an LED, a bank of LEDs, a motor, or any other type of load that can be driven by the driver circuit 330. The electronic circuit 329 may be any type of circuit that drives a load 331, including, but not limited to an integrated circuit that includes a magnetic field sensor.

In FIG. 3A, a driver device 332 and a buffer device 333 may be p-channel FETs. The driver device 332 may have a source terminal 334 coupled to a voltage source 336, and a drain terminal 338 coupled to a source terminal 340 of the buffer device 333. A gate terminal 342 of the driver device 332 may be coupled to a control circuit 344. The buffer device 333 may have a drain terminal 346 coupled to an output terminal 348 of the electronic circuit 329. A biasing circuit 350 may be coupled to a gate terminal 352 of the buffer device 333. A conductor 353 may connect the output terminal 348 to the load circuit 331.

Although both the buffer device 333 and the driver device 332 are shown as p-channel FETs, either or both devices can be replaced by other circuits or devices including, but not limited to, npn BJTs, pnp BJTs, n-channel FETs, logic gates, multiple devices connected in series or parallel configurations, etc.

In operation, the control circuit 344 may drive the gate terminal 342 of the driver device 332 in order to turn the driver device 332 on and off. The biasing circuit 350 may drive the gate terminal 352 of the buffer device 333 to a voltage level that allows the buffer device 333 to remain in a conducting state. The biasing circuit 350 may have a relatively low output resistance 335 so that external interference does not alter the state of the buffer device 333. In an embodiment, the output resistance 335 may be relatively lower than the output resistance 337 of the control circuit 344. The relatively lower resistance 335 may allow the biasing circuit 350 to drive the gate terminal 352 more strongly than the control circuit 344 drives the gate terminal 342. However, this is not a requirement—in alternate embodiments the output resistance 335 may be equal to or greater than the output resistance 337, so long as the biasing circuit 350 can drive the gate terminal 352 more strongly than the control circuit 344 may drive the gate terminal 342.

As the driver device 332 turns on (i.e. enters a conducting state), the voltage at the output terminal 348 may be pulled high. As the driver device 332 turns off (i.e. enters a non-conducting state), the voltage at the terminal 348 may be pulled low by the load circuit 331.

If EMI is coupled onto the conductor 353, the buffer device 333 may buffer the driver device 332 from the EMI. As a result, the EMI may tend to charge or discharge a parasitic capacitance (not shown) between the drain terminal 346 and the gate terminal 352 of the buffer device 333. However, the output resistance 335 of the biasing circuit 350 may be sufficiently low to allow the biasing circuit 350 to continue, in the presence of the EMI, to drive the gate terminal 352 to a level that maintains the buffer device 333 in an on state. This may reduce the occurrence of data errors on the output terminal 348 due to external EMI.

Figure 3B:
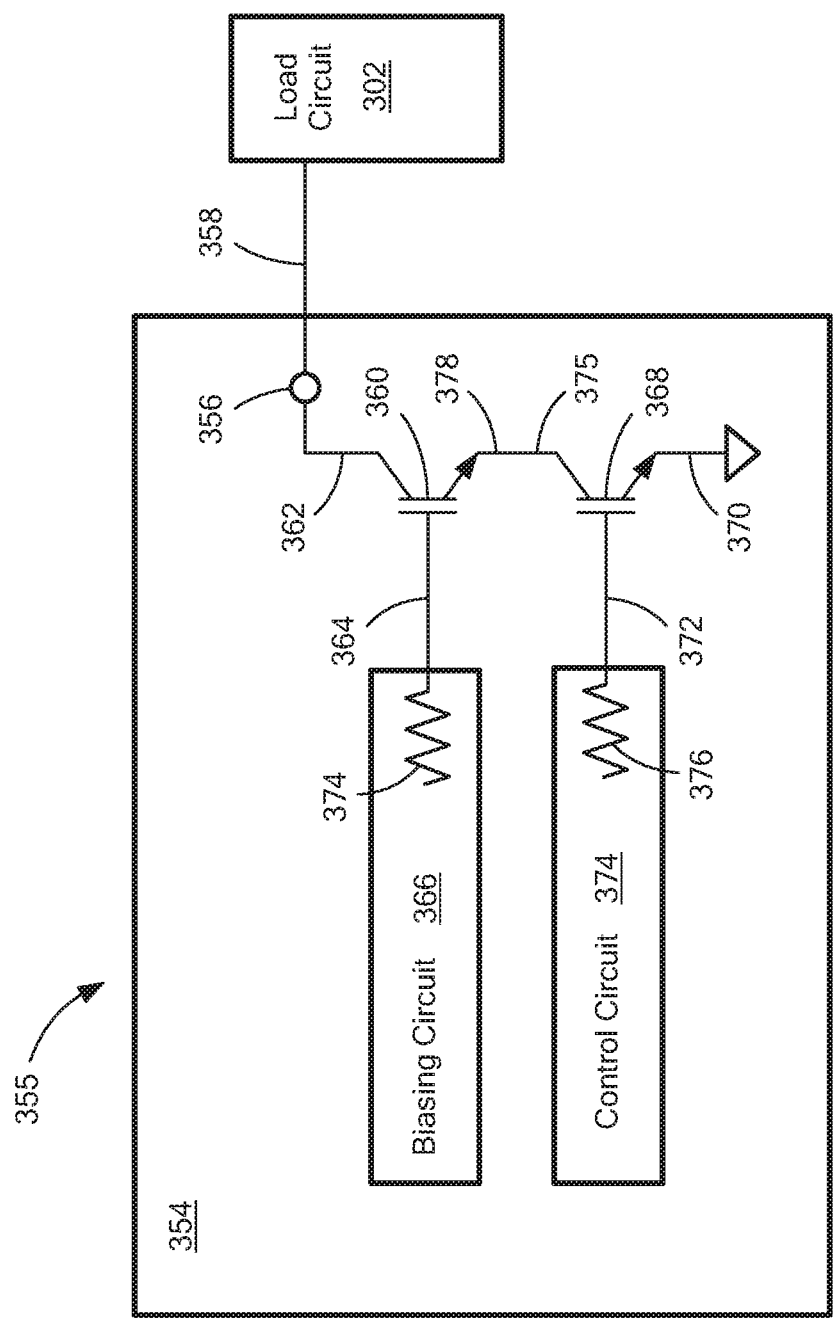
FIG. 3B is a schematic diagram of an embodiment of an output driver circuit.

Referring to FIG. 3B, an embodiment of the invention may include BJT transistors. As shown, an electronic circuit 354 (e.g. an IC) may contain a driver circuit 355 for driving a load 302. The driver circuit 355 may have an output terminal 356 coupled, via a conductor 358, to the load circuit 302. The load circuit 302 may be a pull-up resistor or other circuit that tends to pull the voltage at the output terminal 356 up to a high voltage level. In an embodiment, the electronic circuit 354 may be any type of device that drives a load 302 including, but not limited to, an integrated circuit that includes a magnetic field sensor.

A buffer device 360 may comprise a BJT transistor having a collector terminal 362 coupled to the output terminal 356 and a base terminal 364 coupled to a biasing circuit 366. A driver device 368 may also be a BJT transistor, and may have an emitter terminal 370 coupled to ground and a base terminal 372 coupled to a control circuit 374. A collector terminal 375 of the driver device 368 may be coupled to an emitter terminal 378 of the buffer device 360 so that the buffer device 360 is connected in series between the driver device 368 and the output terminal 356. Although both the buffer device 360 and the driver device 368 are shown as npn BJTs, either or both of the buffer device 360 and the driver device 368 can be replaced by other circuits or devices including, but not limited to, pnp BJTs, n-channel FETs, p-channel FETs, logic gates, multiple devices connected in series or parallel configurations, etc.

Although both the buffer device 360 and the driver device 368 are shown as BJT transistors, either or both devices can be replaced by other circuits or devices including, but not limited to, npn BJTs, pnp BJTs, n-channel FETs, p-channel FETs, logic gates, multiple devices connected in series or parallel configurations, etc.

In operation, the biasing circuit 366 may drive a current into the base terminal 364 of the buffer device 360 in order to maintain the buffer device in an on state (i.e. a conducting state). The control circuit 374 may drive a current into the base terminal 372 to turn the driver device 368 on and off as desired. As the driver device 368 turns on and off, the voltage at the terminal 356 may alternate between a high voltage (i.e. a logic one voltage level) and a low voltage (i.e. a logic zero voltage level). In an embodiment, the output resistance 374 of the biasing circuit 366 may be relatively lower than the output resistance 376 of the control circuit 374 so that the biasing circuit 366 can drive the base terminal 364 more strongly than the control circuit 374 drives the base terminal 372. However, this is not a requirement. In some instances, the output resistance 374 may be equal to or greater than the output resistance 376, so long as the biasing circuit 366 is configured to drive the base terminal 364 more strongly than the control circuit 374 drives the base terminal 372.

The buffer device 360 may act as a so-called buffer by allowing the driver device 368 to control the voltage at the output terminal 356 while reducing the effect that external EMI may have on the driver device 368. For example, the biasing circuit 366 may have a relatively low output resistance 374 so that it can drive the base terminal 364 with a current of sufficient magnitude so that external EMI coupled to the conductor 358 does not cause the buffer device 360 to change state. This may reduce the occurrence of EMI-induced data errors on the output terminal 356.

Embodiments of the present invention may be used to drive the output of any type of IC. In one example, the present invention may be part of a magnetic sensor IC used to detect location, speed, and/or direction of a target. The magnetic sensor IC may include, for example, one or more Hall effect elements, giant magneto-resistance elements, or multiple elements of the same or different types for detecting a ferromagnetic target. In an embodiment, the magnetic sensor IC that can be installed in an automotive application.

In embodiments, the magnetic sensor can be installed in controllers and regulators such as motor drivers, lathe controllers, LED lighting controllers/switches, etc. In one such embodiment, the magnetic sensor can be installed on or near a camshaft in order to measure the position, speed, and/or direction of the camshaft, driveshaft, or wheel. The camshaft may be fitted with a ferromagnetic gear such that, as the gear moves past the magnetic sensor, the sensor can detect features of the gear such as teeth or magnetic regions. This data may be provided to a processor and used to monitor the position of the camshaft in order to control engine timing such as in a fuel injection system.

In some instances, installation of the magnetic sensor requires a relatively long conductor or harness to be installed between the magnetic field sensor and a processor located at some other location within the automobile. The conductor may be a few inches, a few feet, a few meters, or any other length according to the design of the vehicle.

The long conductor can act as an antenna to couple external EMI into the circuit, which can lead to inaccurate speed and position data. In an embodiment, the magnetic sensor may include an output driver that incorporates embodiments of the invention to reduce susceptibility to the EMI, and thus reduce the occurrence of data errors.

Although this example discusses use of the described embodiments in a vehicle, the embodiments described above may be used with any circuit that drives an output.

Figure 4:
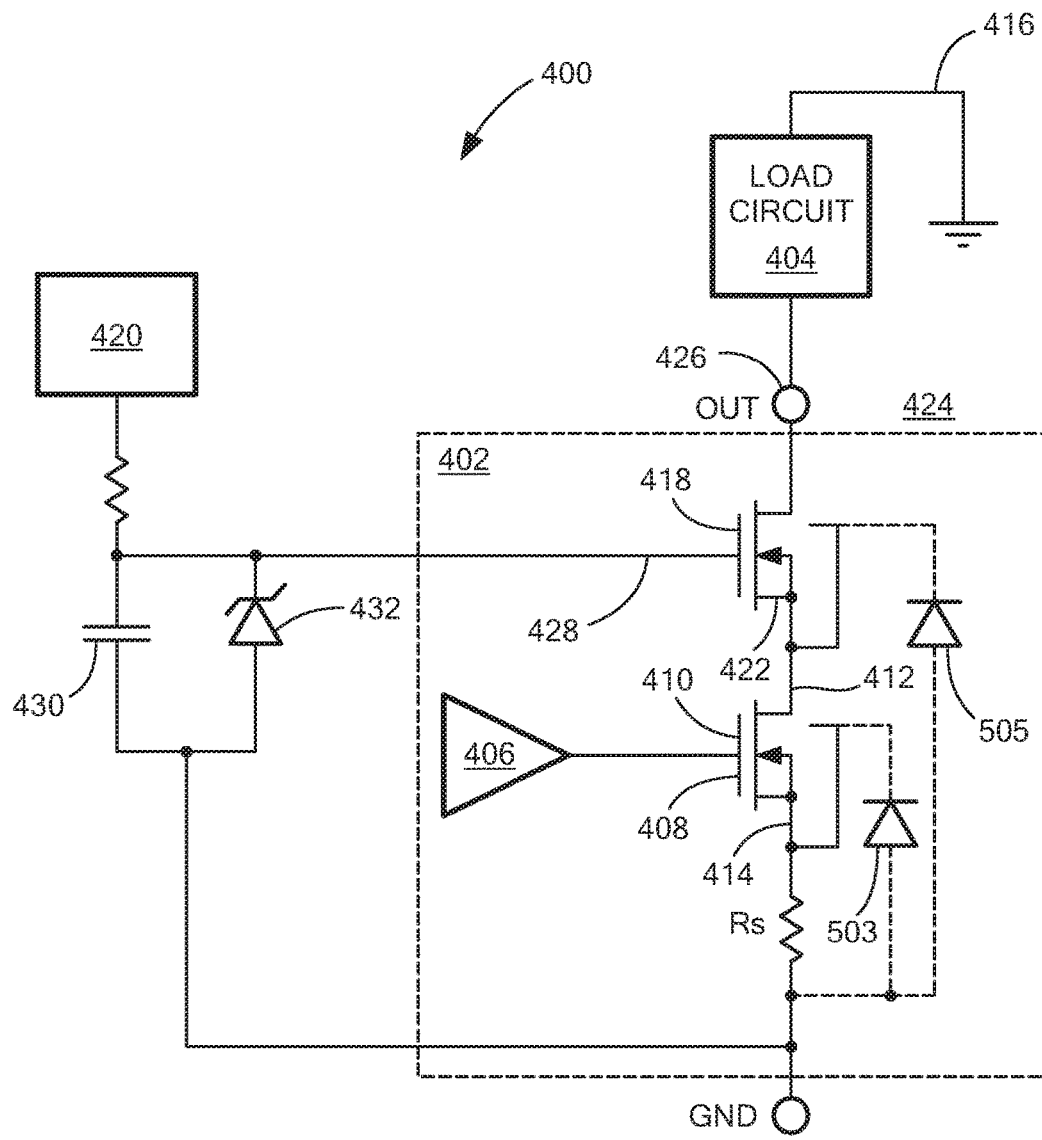
FIG. 4 is a schematic diagram of an embodiment of an output driver circuit.

FIG. 4 is a schematic diagram of an electronic circuit (e.g. an IC) 400 that includes a driver circuit 402 for driving a load circuit 404. Driver circuit 402 may be the same as or similar to driver circuit 304 (FIG. 3) and load circuit 404 may be the same as or similar to load circuit 302 (FIG. 3).

The driver circuit 402 may include a control circuit 406, which may be the same as or similar to control circuit 309, and a driver device 408, which may be the same as or similar to driver device 310. Driver device 408 may be a field-effect transistor (FET) and may have a gate terminal 410, a drain terminal 412, and a source terminal 414. Control circuit 406 may be coupled to and drive gate terminal 410 to cause driver device 408 to conduct or to turn off.

If electronic circuit 400 is installed within an automotive transmission, for example, conductor 416 may be relatively long, e.g., long enough to extend from the location of installation to a central processor. This may require the conductor 416 to be several inches long, several feet long, or several meters long. As described above, this can cause the conductor 416 to act as an antenna, which can charge and/or discharge a parasitic capacitance between gate terminal 410 and drain terminal 412, cause the output of the driver device 410 to inadvertently change state, and introduce EMI-induced errors onto the output terminal 426.

To reduce the occurrence of such errors, driver circuit 402 may include buffer device 418 and biasing circuit 420. In an embodiment, buffer device 418 may be a FET and may comprise a source terminal 422 coupled to the drain terminal 412 of the driver device 408, a drain terminal 424 coupled to the output terminal 426, and a gate terminal 428 coupled to biasing circuit 420. Buffer device 418 may also have a parasitic capacitance (not shown) between each pair of terminals, including between drain terminal 422 and gate terminal 428. In other embodiments, buffer device 418 may be a BJT, a logic gate such as an inverter, or any other active circuit that can be driven to a conducting state. Also, although both the buffer device 418 and the driver device 408 are shown as the same type of component (i.e., shown as n-channel FETs), the buffer device 418 and the driver device 408 may be mixed and matched from different types of circuits or components. For example, in an embodiment, the buffer device 418 may be one of an n-channel FET, a p-channel FET, a BJT, a logic gate, multiple devices in series or parallel, or any appropriate type of buffer device, and the driver device 408 may be one of an n-channel FET, a p-channel FET, a BJT, a logic device, multiple devices in series or parallel, or any other appropriate driver device.

Although both the buffer device 418 and the driver device 408 are shown as n-channel FETs, either or both devices can be replaced by other circuits or devices including, but not limited to, npn BJTs, pnp BJTs, p-channel FETs, logic gates, multiple devices connected in series or parallel configurations, etc.

Electronic circuit 400 may also include a capacitor 430 and a Zener diode 432 coupled between gate terminal 428 and a reference voltage (shown as ground in FIG. 4, for example). Capacitor 430 may act as a bulk and/or filter capacitor that acts to maintain the voltage out gate terminal 428. Zener diode 432 may provide an alternate overvoltage protection path between terminal 426 or biasing circuit 420 and the reference voltage (shown as ground in FIG. 4, for example).

In operation, the biasing circuit 420 may drive the voltage at the gate terminal 428 so that the buffer device 418 remains on, i.e. in a conducting state. While the buffer device 418 is conducting, the buffer device 418 may not affect the ability of the driver device 408 to drive the output. In other words, when the buffer device 418 is on, the driver device 408 may still be able to pull the voltage at the output terminal 426 low. Also, with the buffer device 418 on, the driver device 408 may be able to enter a non-conducting state so that the voltage at the output terminal 426 can be pulled up to a logic one (e.g. a logic high) level by the load circuit 404.

In an embodiment, the biasing circuit 420 may provide a constant voltage to the gate terminal 428. For example, the biasing circuit 420 may set the voltage at the gate terminal 428 to a level that allows the buffer device 418 to remain in a conducting state. If the biasing device 418 is a FET, the biasing circuit 420 may set the voltage at the gate terminal 428 to place the FET into saturation or a conductive tristate.

The biasing circuit 420 may have a relatively low output resistance so that the buffer device 418 is not weakly driven. For example, the biasing circuit may be a resistor divider with relatively low resistance, a voltage regulator, or any other circuit with relatively low output resistance that can drive the gate terminal 428 to a particular voltage. In an embodiment, the output resistance of the biasing circuit will be relatively lower than the output resistance of the control circuit 406. This may allow the biasing circuit 420 to drive the buffer device 418 more strongly than the control circuit 406 drives the driver device 408.

The low output resistance can help to reduce the effects of EMI interference from an external source. Assume that EMI pulses are introduced onto the conductor 416. The EMI pulses may act to charge or discharge the parasitic capacitance between the drain terminal 412 and the gate terminal 410. However, since the biasing circuit 420 has a relatively low output resistance, the biasing circuit 420 may be able to drive the gate terminal 428 strongly enough so that the EMI pulses are unable to cause the buffer device 418 to switch state. Since the buffer device 418 driven hard, it may be less likely to switch state in the presence of EMI, and it may act as a buffer and isolate the driver device 408 from the effects of EMI pulses on the conductor 416. In alternate embodiments the output resistance of biasing circuit 420 may be equal to or greater than the output resistance of control circuit 406, so long as the biasing circuit 420 can drive gate terminal 428 more strongly than the control circuit 406 may drive gate terminal 410.

Figure 5:
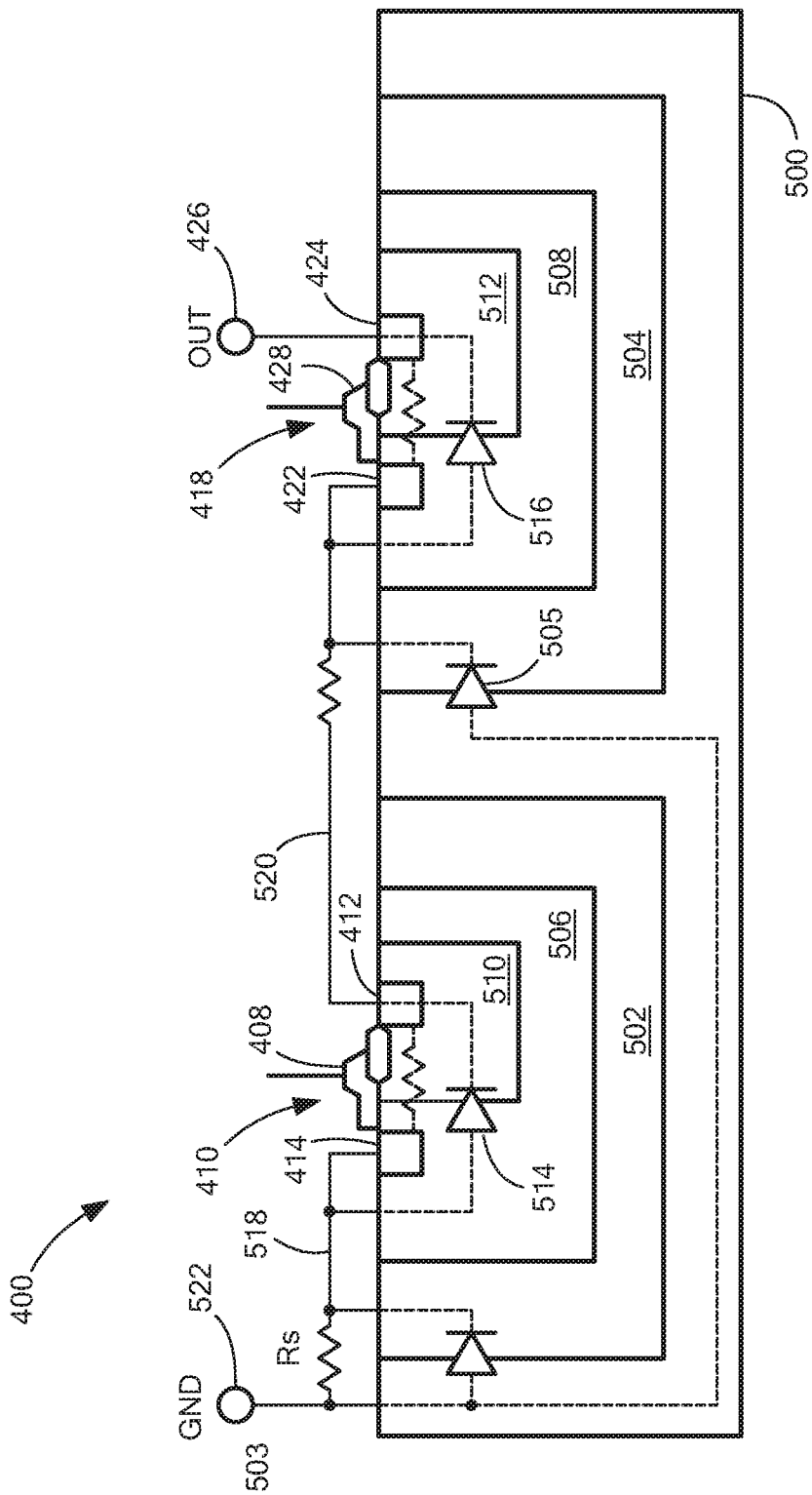
FIG. 5 is a cross-sectional view of a semiconductor substrate supporting the output driver circuit of FIG. 4.

Referring also to FIG. 5, electronic circuit 400 is constructed in a semiconductor substrate 500. A cross-sectional view of the semiconductor substrate is shown.

Substrate 500 may be silicon or any other type of appropriate semiconductor material that can support integrated circuitry. In an embodiment, substrate 500 may be an n- or p-doped substrate.

Substrate 500 may include two tub areas 502 and 504. Tub areas 502 and 504 may be doped regions within substrate 500, that have an opposite doping type to substrate 500. For example, if substrate 500 is n-doped, then tub areas 502 and 504 may be p-doped, or vice versa. The interface between substrate 500 and tub area 502 forms a PN junction (as indicated by diode symbol 503 in FIG. 4 and FIG. 5) and the interface between substrate 500 and tub area 504 forms a PN junction (as indicated by diode symbol 505 in FIG. 4 and FIG. 5).

Within each tub area 502 and 504 is a respective well area 506 and 508. Well areas 506 and 508 may also be doped-regions. In an embodiment, well areas 506 and 508 share the same doping type as substrate 500, and have an opposite doping type to that of tub areas 502 and 504. The interface between tub area 502 and well area 506, and the interface between tub area 504 and well area 508, may also form PN junctions.

Within each well area 506 and 508 is a respective high voltage drain area 510 and 512. High voltage drain areas 510 and 512 may also be doped regions and may have a doping type that is the same as tub areas 502 and 504, and opposite that of substrate 500 and well areas 506 and 508. The interface between well area 506 and high voltage drain area 510 may form a PN junction as indicated by diode symbol 514, and the interface between well area 508 and high voltage drain area 512 may form a PN junction as indicated by diode symbol 516.

In one embodiment, substrate 500 and well areas 506 and 508 are p-doped regions; and tub areas 502 and 504, and high voltage drain areas 510 and 512 are n-doped regions. In another embodiment, substrate 500 and well areas 506 and 508 are n-doped regions; and tub areas 502 and 504, and high voltage drain areas 510 and 512 are p-doped regions.

The doped areas described above (and those described below) have been labeled as a substrate, tub areas, well areas, and high voltage drain areas. The labels are used for convenience to differentiate the areas from each other and are not intended to describe any limiting structure or function of the doped regions.

As shown in FIG. 5, driver device 408 may be formed in well area 506 of the semiconductor substrate. High voltage drain area 510 may, for example, form or surround the drain terminal 412 of driver device 408. A deposit on the surface of the semiconductor substrate may form gate terminal 410. The deposit may comprise metal, gate oxide, field oxide, or other layers that may be used to form a MOS structure.

Similarly, buffer device 418 may be formed within well area 508 of the semiconductor substrate. High voltage drain area 512 may, for example, form or surround the drain terminal 424 of buffer device 418. A metal deposit on the surface of the semiconductor substrate may form gate terminal 428.

Metal (and/or other types of) layers on the surface of substrate 500 may provide electrical connections. For example, conductor 518 may be a metal deposit on the surface of substrate 500 that creates a short circuit between tub area 502 and well area 506 and source terminal 414 of driver device 408. Conductor 520 may be a metal deposit on the surface of substrate 500 that creates a short circuit between drain terminal 412 of driver device 408 (and the associated high voltage drain area 510), tub area 504, well area 508, and source terminal 422 of buffer device 418. A resistor $R_s$ may also be formed on the surface of substrate 500 between substrate 500 and tub area 502. The conductors and resistors may be formed using any known technique for forming conductors and resistors on the surface of a silicon substrate.

In an embodiment, the elements described above may form an overvoltage conduction path through substrate 500. In the case of an overvoltage event (such as an ESD event, for example), these elements may provide a path through which current associated with the overvoltage event can flow without damaging the integrated circuit.

Say, for example, that an ESD event occurs between reference terminal 522 and output terminal 426. Current may flow from reference terminal 522, through resistor Rs, through conductor 518 into well area 506, through the PN junction between high voltage drain area 510 and well area 506, through conductor 520 into the source area 422 of transistor 418, through the channel region of transistor 418 and the drain area 424, and finally out to terminal 426. In an embodiment, biasing circuit 420 may maintain transistor 418 in a conducting state, which may allow the current to flow through the channel region of transistor 418 and/or drain area 424.

The current may also flow through a second conduction path: from reference terminal 522 into substrate 500, through the PN junction between substrate 500 and tub area 504, through conductor 520 into the source area 422 of transistor 418, through the channel region of transistor 418 (since transistor is always on due to biasing circuit) and the drain area 424, and finally out to terminal 426. There may be other paths that provide current flow through substrate 500 in the case of an overvoltage event.

In some instances, if substrate 500 contains two tub areas and/or two well areas as shown, an overvoltage event that follows one of the paths listed above can cause the electronic circuit to malfunction.

In case when the current chooses the second path described above, the current flowing through the forward biased diode 505 may result in the injection of minority carriers into the substrate (electron injection from n-tub into p-substrate). As minority carriers in the p-substrate, electrons may remain in the substrate without recombination for relatively long period of time and diffuse considerable distances through the substrate to reach other sections of the circuit, where they may be collected by a positively biased n-tubs. The currents associated with the collection of electrons by other n-tubs can cause malfunction in other circuits. For example, in the case of Hall transducers, the parasitic currents may perturb small signals representing magnetic input.

Figure 6:
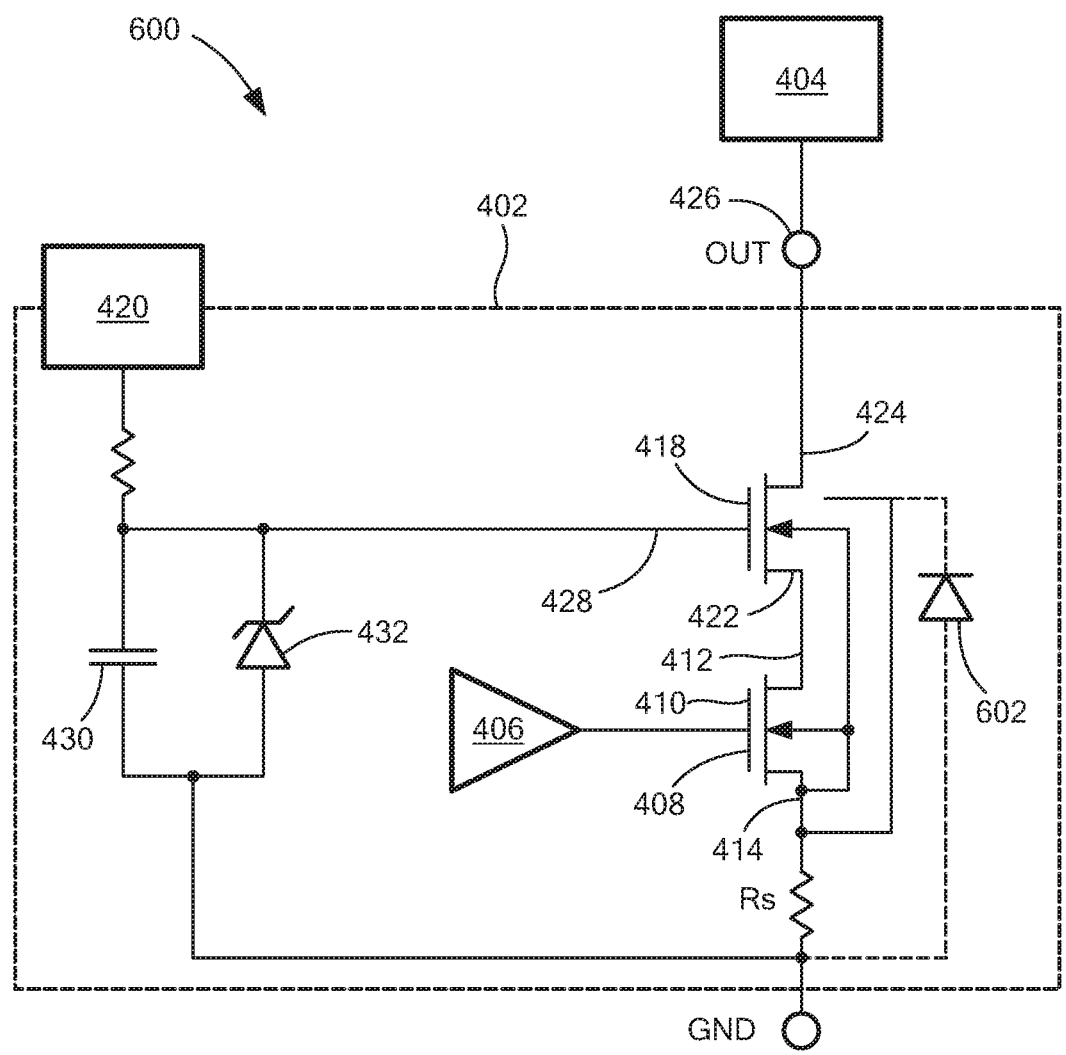
FIG. 6 is a schematic diagram of an embodiment of an output driver circuit.
Figure 7:
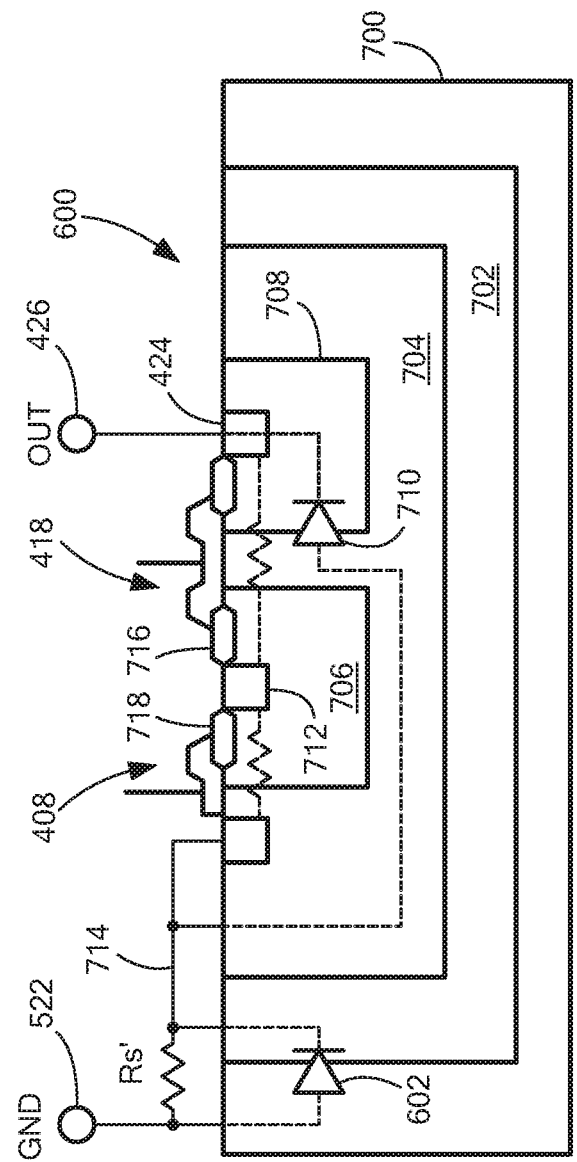
FIG. 7 is a cross-sectional view of a semiconductor substrate supporting the output driver circuit of FIG. 6.

Turning to FIG. 6 and FIG. 7, an embodiment of an electronic circuit 600 is shown, which may be the same as or similar to electronic circuit 400. FIG. 6 is a schematic diagram of electronic circuit 600 and FIG. 7 is a cross sectional view of a silicon substrate 700 that may support electronic circuit 600. One skilled in the art will notice that many of the circuit elements shown in electronic circuit 600 in FIG. 6 are the same as or similar to the circuit elements in electronic circuit 400 in FIG. 4. For example, both circuits have a driver device 408, a driver circuit 406, a buffer device 418, and a biasing circuit 420. In an embodiment, one difference between electronic circuit 400 and electronic circuit 600 is the overvoltage conduction paths as described above. One will note that diode symbol 503 and 505 of FIG. 4 are replaced by diode symbol 602 in FIG. 6 (also shown in FIG. 7). In an embodiment, this may be due to a different integrated circuit layout for electronic circuit 600, as shown in FIG. 7. Electronic circuit 600 may also include the Zener diode 432 and capacitor 430 shown in FIG. 4 and described above.

Referring now to FIG. 7, a semiconductor substrate 700 may support electronic circuit 600 and may have a first doping type. Semiconductor substrate 700 may be the same as or similar to semiconductor substrate 500.

A tub area 702 may be formed within semiconductor substrate 500. In an embodiment, tub area 702 may have a doping type opposite to that of semiconductor substrate 700. For example, if semiconductor substrate 700 is n-doped, then tub area 702 may be p-doped. The interface between semiconductor substrate 700 and tub area 702 may form a PN junction, as shown by diode symbol 602.

Within tub area 702 is well area 704. Well area 704 may also be a doped-region. In an embodiment, well area 704 shares the same doping type as substrate 700, and has an opposite doping type to that of tub area 702. The interface between tub area 702 and well area 704 may form a PN junction.

Within well area 704 may be high voltage drain areas 706 and 708. High voltage drain areas 706 and 708 may also be doped regions and may have a doping type that is the same as tub area 702, and opposite that of substrate 700 and well area 704. The interface between well area 704 and high voltage drain area 706 may form a PN junction, and the interface between well area 704 and high voltage drain area 708 may form a PN junction as indicated by diode symbol 710.

In one embodiment, substrate 700 and well area 704 are p-doped regions; while tub area 702 and high voltage drain areas 706 and 708 are n-doped regions. In another embodiment, substrate 700 and well area 704 are n-doped regions; while tub area 702 and high voltage drain areas 706 and 708 are p-doped regions Driver device 408 and buffer device 418 may be formed as part of the same integrated circuit structure. For example, the drain terminal of driver device 408 and the source terminal of buffer device 418 may be constructed as the same shared terminal 712. High voltage drain area 706 may be associated with the drain terminal of driver device 408, which is the shared terminal 712. High voltage drain area 708 may be associated with drain terminal 424 of buffer device 418. Also, driver device 408 and buffer device 418 may be formed in the same well area 704.

Metal (and/or other types of) layers on the surface of substrate 700 may provide electrical connections. For example, conductor 714 may be a metal deposit on substrate 700 that creates a short circuit between tub area 702 and well area 704. A resistor $R_s'$ may also be formed on substrate 700 between substrate 700 and tub area 702. The conductors and resistors may be formed using any known technique for forming conductors and resistors on a semiconductor substrate.

In an embodiment, the elements described above may form an overvoltage conduction path through substrate 700. In the case of an overvoltage event (such as an ESD event, for example), these elements may provide a path through which current associated with the overvoltage event can flow without damaging the integrated circuit.

Say, for example, that an ESD event occurs between reference terminal 522 and output terminal 426. Current may flow from reference terminal 522 through resistor $R_s'$, through conductor 714 into well area 704, through the PN junction 710 between well area 704 and high voltage drain area 708, and finally out to terminal 426.

Figure 8:
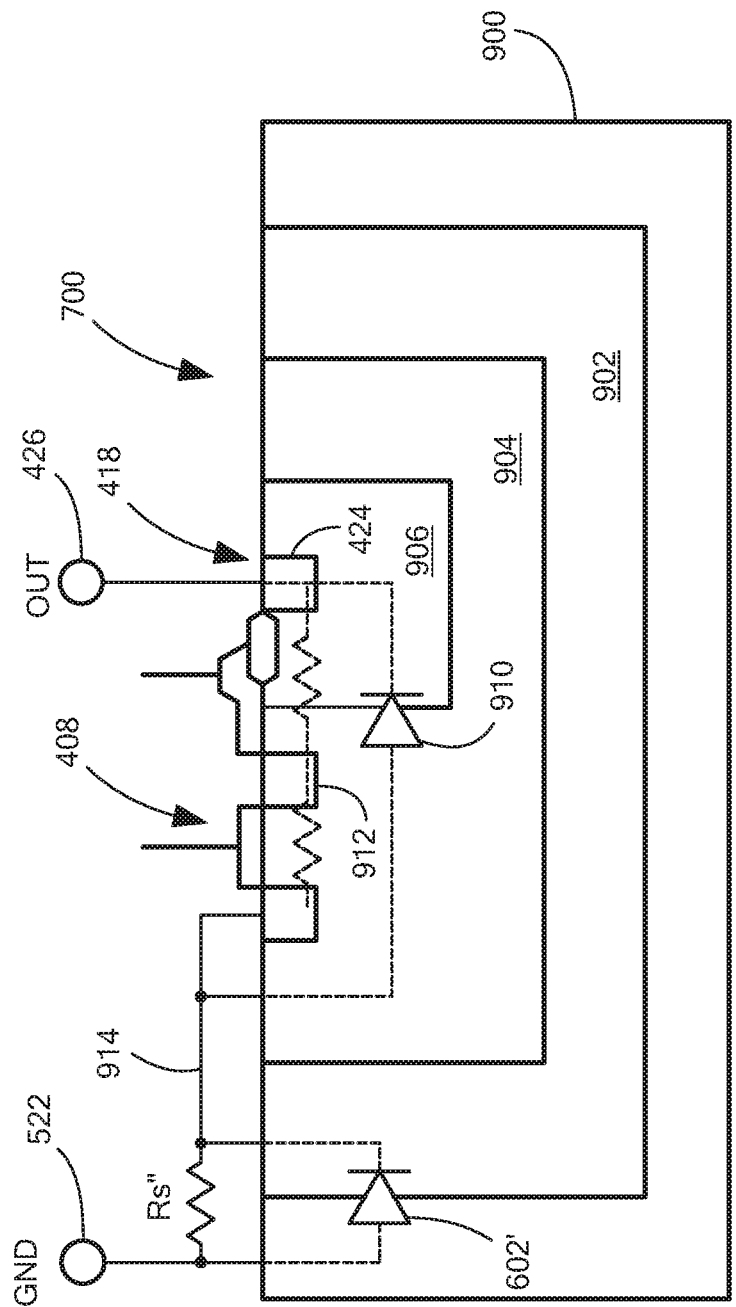
FIG. 8 is a cross-sectional view of a semiconductor substrate supporting the output driver circuit of FIG. 6.

FIG. 8 is a cross sectional view of a semiconductor substrate 900, having a first doping type, that may also support electronic circuit 600. Semiconductor substrate 900 may be the same as or similar to semiconductor substrate 500 and/or semiconductor substrate 700.

A tub area 902 may be formed within semiconductor substrate 900. In an embodiment, tub area 902 may have a doping type opposite to that of semiconductor substrate 900. For example, if semiconductor substrate 900 is n-doped, then tub area 902 may be p-doped. The interface between semiconductor substrate 900 and tub area 902 may form a PN junction, as shown by diode symbol 602'.

Within tub area 902 may be a well area 904. Well area 904 may also be a doped-region. In an embodiment, well area 904 shares the same doping type as substrate 900, and has an opposite doping type to that of tub area 902. The interface between tub area 902 and well area 904 may form a PN junction.

Within well area 904 may be a high voltage drain area 906. High voltage drain area 906 may also be a doped region and may have a doping type that is the same as tub area 902, and opposite that of substrate 900 and well area 904. The interface between well area 904 and high voltage drain area 906 may form a PN junction as indicated by diode symbol 910.

In one embodiment, substrate 900 and well area 904 are p-doped regions; while tub area 902 and high voltage drain area 906 are n-doped regions. In another embodiment, substrate 900 and well area 904 are n-doped regions; while tub area 902 and high voltage drain area 906 are p-doped regions.

In an embodiment, driver device 408 and buffer device 418 may be formed as part of the same integrated circuit structure. For example, the drain terminal of driver device 408 and the source terminal of buffer device 418 may be constructed as the same, shared terminal 912. High voltage drain area 906 may be associated with drain terminal 424 of buffer device 418.

Also, driver device 408 and buffer device 418 may be formed in the same well area 904.

In an embodiment, driver device 408 may be constructed as a high voltage transistor. As shown in FIG. 7, driver device 408 may be a high voltage transistor that includes high voltage drain area 706, oxide isolation deposit 718 between the gate and drain terminals of driver device 408, and oxide isolation deposit 716 between the gate and source terminals of buffer device 418. Oxide isolation deposits 716 and 718 may be formed, for example, through a thermal growth process or through a shallow trench isolation (STI) process. In FIG. 8, driver device 408 may not be a high voltage transistor and may lack high voltage drain area 706, oxide isolation deposit 716, and/or oxide isolation deposit 718.

Metal (and/or other types of) layers of substrate 900 may provide electrical connections. For example, conductor 914 may be a metal deposit on substrate 900 that creates a short circuit between tub area 902 and well area 904. A resistor $R_s''$ may also be formed on the surface of substrate 900 between substrate 900 and tub area 902. The conductors and resistors may be formed using any known technique for forming conductors and resistors on a semiconductor substrate.

In an embodiment, the elements described above may form an overvoltage conduction path through substrate 900. In the case of an overvoltage event (such as an ESD event, for example), these elements may provide a path through which current associated with the overvoltage event can flow without damaging the integrated circuit.

Say, for example, that an ESD event occurs between reference terminal 522 and output terminal 426. Current may flow from reference terminal 522 through resistor $R_s''$, through conductor 914 into well area 904, through the PN junction 910 between well area 904 and high voltage drain area 906, and finally out to terminal 426.

Having described exemplary embodiments of the invention, it will now become apparent to one of ordinary skill in the art that other embodiments incorporating the concepts may also be used. The embodiments contained herein should not be limited to disclosed embodiments but rather should be defined by the claims. All publications and references cited in this document are incorporated here by reference in their entirety.

The invention claimed is:

1. An electronic circuit comprising:
   a semiconductor substrate having a first doping type;
   a reference terminal coupled to the semiconductor substrate;
   a tub area having a second doping type and formed in the semiconductor substrate;
   a well area having the first doping type and formed within the tub area;
   a driver circuit comprising a first transistor formed within the well area and having an output terminal that can be coupled to a load to drive the load;
   a control circuit coupled to the driver circuit for controlling the driver circuit;
   a second transistor formed within the well area and coupled in series between the driver circuit and the output terminal, the second transistor having a first terminal coupled to the driver circuit and a second terminal coupled to the output terminal; and
   a biasing circuit coupled to a gate terminal of the second transistor and configured to bias the second transistor to a conducting state; and
   an overvoltage conduction path between the output terminal and the reference terminal.

2. The electronic circuit of claim 1 wherein the overvoltage conduction path comprises a PN junction between the substrate and the tub area.

3. The electronic circuit of claim 2 wherein the overvoltage conduction path comprises a PN junction between the well area and a high voltage drain pocket associated with the second transistor.

4. The electronic circuit of claim 2 wherein the overvoltage conduction path comprises a resistor between the substrate and the tub area.

5. The electronic circuit of claim 2 wherein the first transistor is a field-effect transistor having a gate terminal coupled to the control circuit or a BJT transistor having a base terminal coupled to the control circuit.

6. The electronic circuit of claim 1 wherein the biasing circuit has an output resistance sufficiently low to maintain the second transistor in the conducting state in the presence of electromagnetic interference.

7. The electronic circuit of claim 1 wherein the output resistance of the biasing circuit is lower than an output resistance of the control circuit.

8. The electronic circuit of claim 1 wherein the biasing circuit comprises a voltage regulator.

9. The electronic circuit of claim 1 wherein the electronic circuit is a magnetic field sensor.

10. The electronic circuit of claim 1 wherein the first doping type is a p-doping type and the second doping type is an n-doping type.

11. The electronic circuit of claim 1 further comprising a short circuit between the tub area and the well area.

12. The electronic circuit of claim 1 wherein the first and second transistors are formed as part of the same integrated circuit structure.

13. An apparatus comprising:
    a semiconductor substrate;
    a reference terminal coupled to the semiconductor substrate;
    a well area formed within the substrate;
    a transistor formed within the well area, the transistor having a first terminal coupled to a driver circuit and a second terminal coupled to an output terminal;
    a biasing circuit coupled to a gate terminal of the transistor and configured to bias the transistor to a conducting state; and
    an overvoltage conduction path through the substrate between the reference terminal and the output terminal, the overvoltage conduction path comprising:
       a PN junction formed between the substrate and a tub area formed within the substrate; and
       a PN junction formed between the well area and a high voltage drain area associated with the transistor.

14. The apparatus of claim 13 wherein the semiconductor substrate and the well area have a first doping type and the tub area has a second doping type.

15. The apparatus of claim 14 wherein the first doping type is a p-doping type and the second doping type is an n-doping type.

16. The apparatus of claim 13 wherein the driver circuit is an electronic switch having a control terminal coupled to a control circuit.

17. The apparatus of claim 13 wherein the driver circuit is a field-effect transistor having a gate terminal coupled to the control circuit or a BJT transistor having a base terminal coupled to the control circuit.

18. The apparatus of claim 13 wherein the biasing circuit has an output resistance sufficiently low to maintain the transistor in the conducting state in the presence of electromagnetic interference.

19. The apparatus of claim 13 wherein the biasing circuit comprises a voltage regulator.

20. The apparatus of claim 13 wherein the apparatus is a magnetic field sensor.

21. The apparatus of claim 13 further comprising a short circuit between the tub area and the well area.

* * * * *

UNITED STATES PATENT AND TRADEMARK OFFICE
CERTIFICATE OF CORRECTION

PATENT NO. : 10,234,887 B2
APPLICATION NO. : 15/161529
DATED : March 19, 2019
INVENTOR(S) : Richard B. Cooper et al.

Page 1 of 1

It is certified that error appears in the above-identified patent and that said Letters Patent is hereby corrected as shown below:

In the Specification

Column 1, Line 43, delete "period" and replace with --periods--.

Column 1, Lines 45-46, delete "by a" and replace with --by--.

Column 6, Line 49, delete "state." and replace with --states.--.

Column 6, Line 49, delete "driven hard," and replace with --is driven hard,--.

Column 6, Line 60, delete "resistor" and replace with --resistor,--.

Column 10, Line 48, delete "driven hard," and replace with --is driven hard,--.

Column 12, Line 6, delete "Rs," and replace with --$R_s$,--.

Column 12, Line 30, delete "In case" and replace with --In the case--.

Column 12, Line 36, delete "period" and replace with --periods--.

Column 12, Line 38, delete "by a positively" and replace with --by positively--.

Column 12, Line 57, delete "symbol" and replace with --symbols--.

Signed and Sealed this
Eighteenth Day of February, 2020

Andrei Iancu
*Director of the United States Patent and Trademark Office*